United States Patent [19]

Temple

[11] 4,219,833
[45] Aug. 26, 1980

[54] MULTIGATE LIGHT FIRED THYRISTOR AND METHOD

[75] Inventor: Victor A. K. Temple, Clifton Park, N.Y.

[73] Assignee: Electric Power Research Institute, Inc., Palo Alto, Calif.

[21] Appl. No.: 907,931

[22] Filed: May 22, 1978

[51] Int. Cl.² .......................................... H01L 29/74
[52] U.S. Cl. ...................................... 357/38; 357/30; 357/86
[58] Field of Search ............................. 357/38, 30, 86

[56] References Cited

U.S. PATENT DOCUMENTS

| B 561,732 | 2/1976 | Roberts | 29/578 |
|---|---|---|---|
| 3,489,962 | 1/1970 | McIntyre | 317/235 |
| 3,622,845 | 11/1971 | McIntyre | 317/235 R |
| 3,893,153 | 7/1975 | Page | 357/38 |
| 3,938,173 | 2/1976 | Jackson | 357/19 |
| 4,016,592 | 4/1977 | Yatsuo | 357/38 |
| 4,040,170 | 8/1977 | Schlegel | 29/577 |
| 4,047,219 | 9/1977 | Temple | 357/38 |
| 4,060,826 | 11/1977 | Voss | 357/20 |
| 4,079,406 | 3/1978 | Burtscher | 357/38 |
| 4,122,480 | 10/1978 | Silber | 357/38 |
| 4,142,201 | 2/1979 | Sittig | 357/38 |

OTHER PUBLICATIONS

Silber et al., *IEEE Transactions on Electron Devices*, vol. Ed-23, No. 8, Aug. 1976; pp. 899–904.
DeBruyne et al., *1976 IEEE Conf. Record of the Power Electronic Specialist*, pp. 262–266.
Zucker et al., *Appl. Phys. Lett.*, vol. 29, No. 4, 15 Aug. 1976.
Temple et al., *IEEE Trans. on Electron Devices*, vol. Ed-23, No. 8, Aug. 1976, pp. 893–898.
Silber et al., *1975 Int. Electron Device Meeting Conf. Record*, pp. 371–373.
Schlegel et al., *1975 Int. Electron Device Meeting Conf. Record*, pp. 371–373.

Primary Examiner—Martin H. Edlow
Attorney, Agent, or Firm—Flehr, Hohbach, Test, Albritton & Herbert

[57] ABSTRACT

A light-fired thyristor is provided with a plurality of discrete light-receiving regions widely separated over the top surface of a semiconductor body. Each light-receiving region serves as a separate source of gate current for turning on the thyristor. The method of firing includes simultaneously illuminating the light-receiving regions preferably by means of multiple light fibers.

18 Claims, 12 Drawing Figures

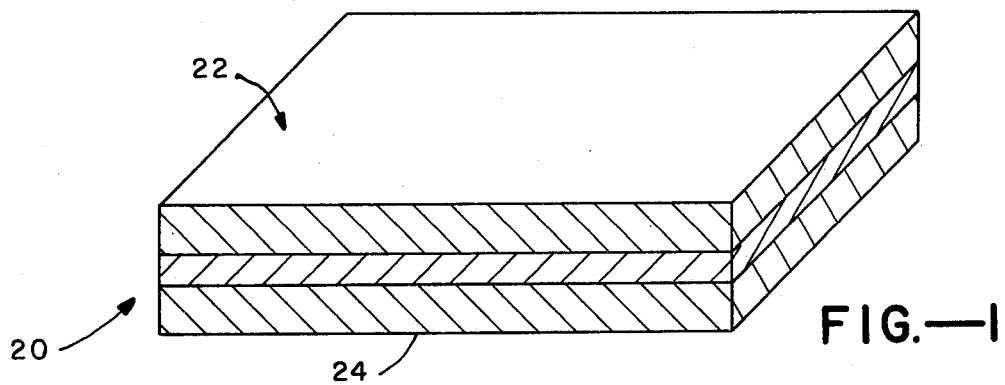
FIG.—1
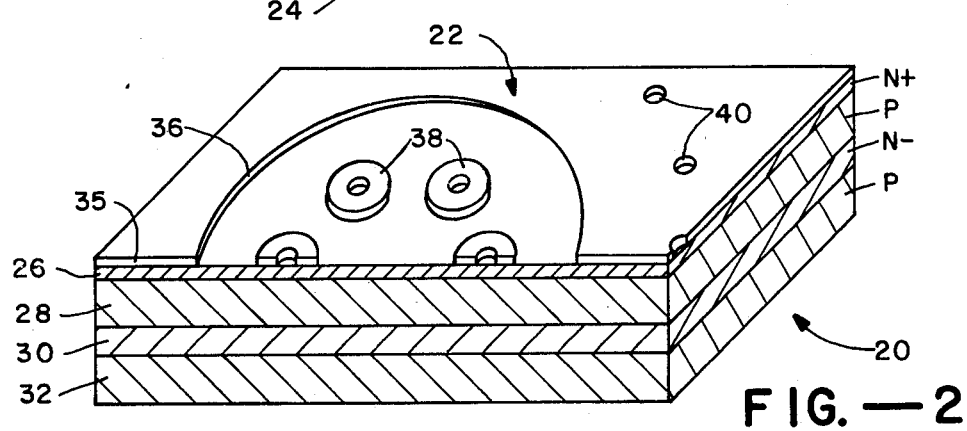
FIG.—2
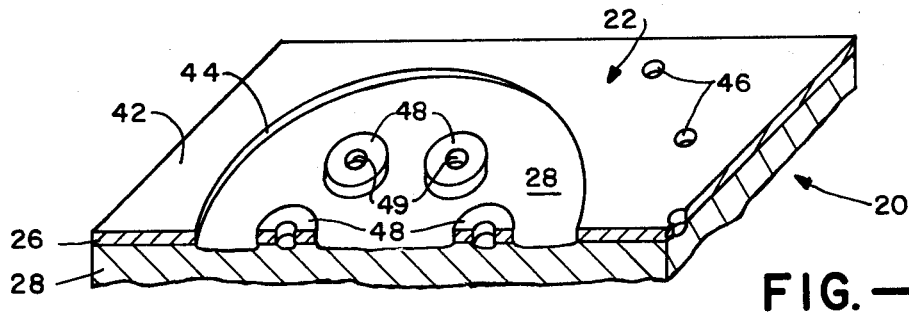
FIG.—3
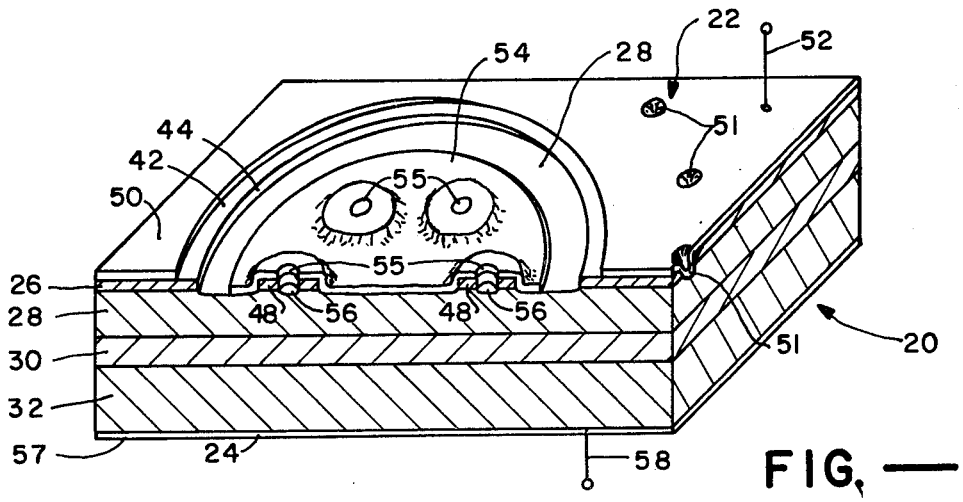
FIG.—4

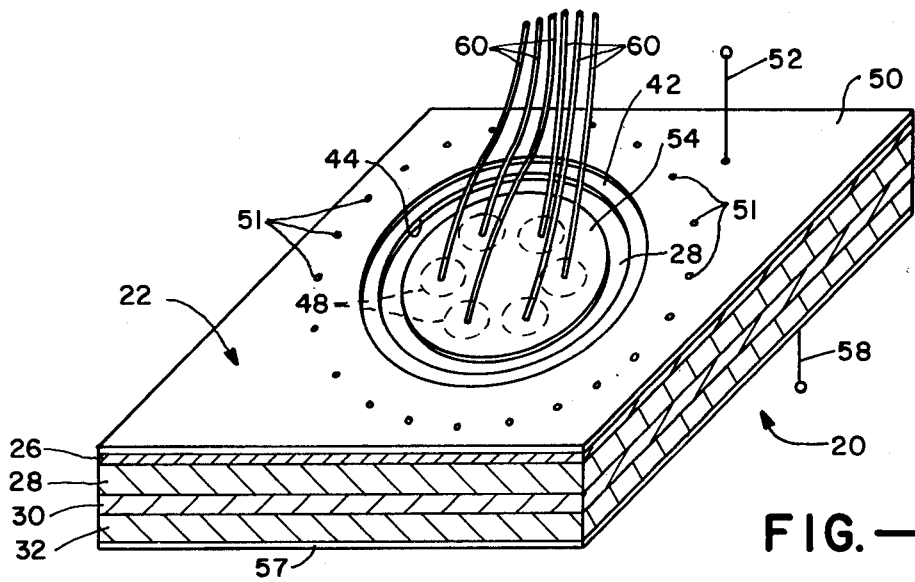
FIG.—5
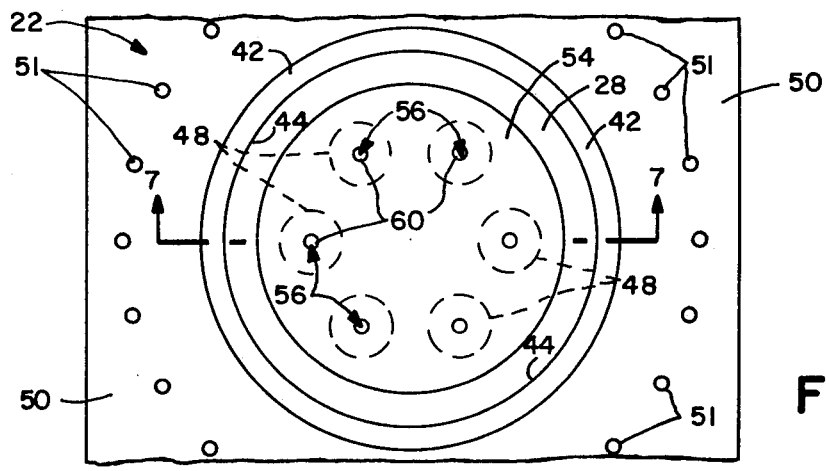
FIG.—6
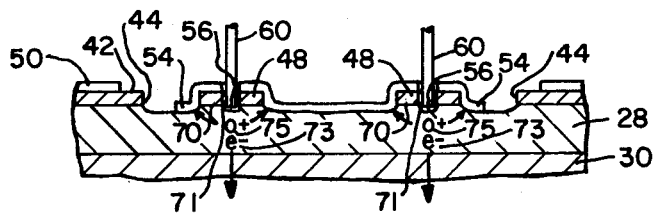
FIG.—7
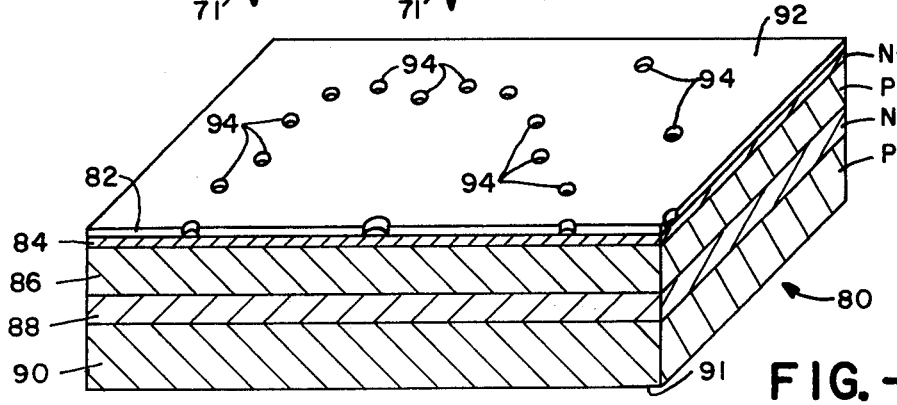
FIG.—8

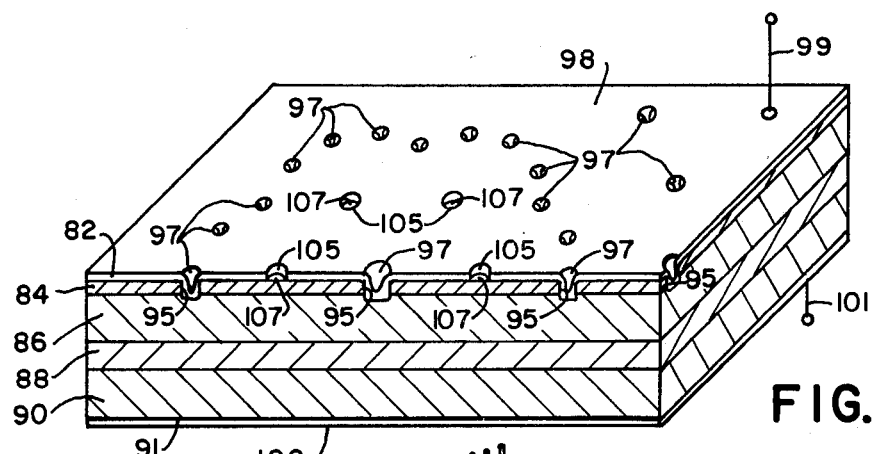
FIG.—9
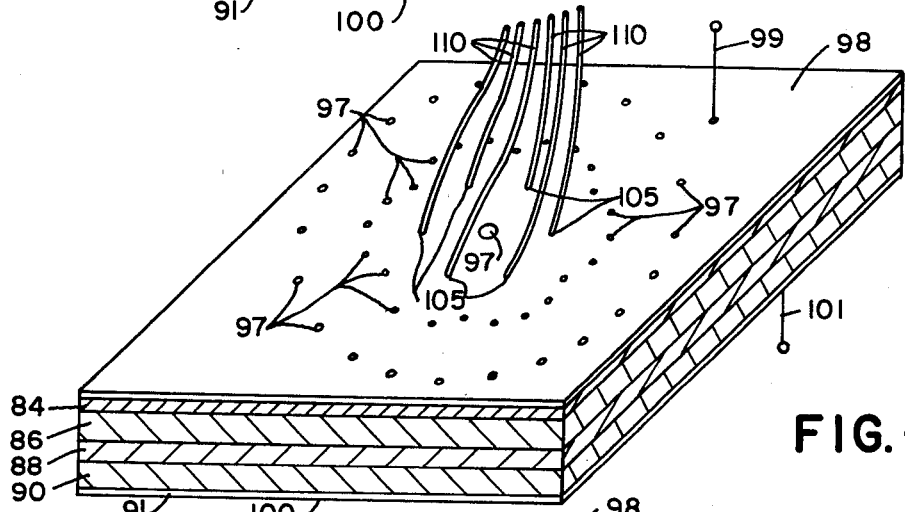
FIG.—10
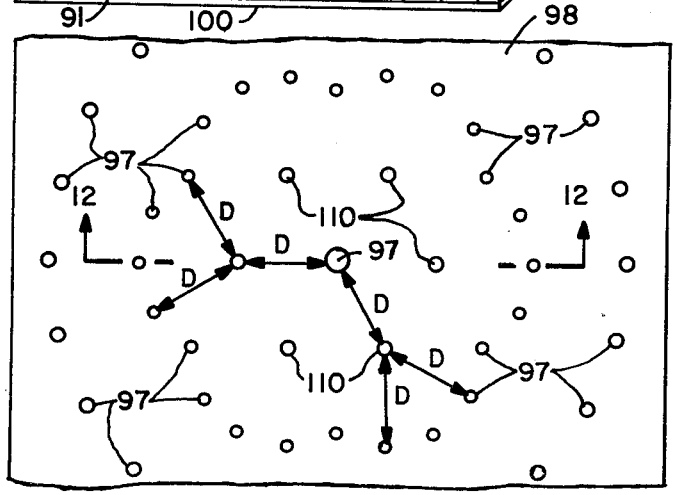
FIG.—11
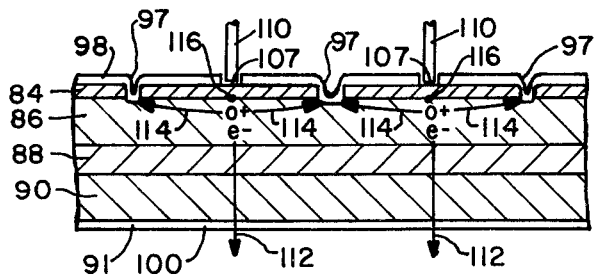
FIG.—12

4,219,833

MULTIGATE LIGHT FIRED THYRISTOR AND METHOD

BACKGROUND OF THE INVENTION

This invention relates to thyristors of the type employing photogeneration to provide gate current, such thyristors being generally known as light-fired thyristors.

Light-fired thyristors are particularly useful in controlling high voltage circuits where a high degree of electrical isolation is important. High voltage circuit control can be achieved from a relatively distant location through use of conventional light fibers to carry triggering light pulses from a light source to the thyristor. The light fibers employed have diameters as small as two or three thousandths of an inch. To enable the fibers to carry sufficient light to trigger a thyristor, numerous single fibers are bundled together to form a larger light conduit which is tied directly to the thyristor.

Even using numerous light fibers, the amount of available gate current supplied to the thyristor through photogeneration is low. Gate sensitivity must therefore be high. Typically, light-fired thyristors have relatively short turn-on lines; the turn-on line being the portion of the emitter-base junction closest to the source of gate current. A short turn-on line yields improved gate sensitivity but also reduces the available turned-on junction area when the thyristor begins to conduct. As a result, prior art light-fired thyristors are susceptible to premature failure resulting from excessive current gradients (di/dts) during initial turn-on.

OBJECTS AND SUMMARY OF THE INVENTION

It is the general object of the present invention to provide a light-fired thyristor having an improved di/dt rating.

Another object of the invention is to provide a method of firing a light-fired thyristor which increases the initial turn-on area.

Accordingly, a light-fired thyristor is provided having a semiconductor body with at least four zones of alternate conductivity type and having a top surface. The body has a first zone extending to the top surface. The first zone includes at least one emitter. There is also provided a plurality of separated light-receiving regions on the top surface for receiving light to initiate thyristor turn-on at a plurality of separated locations.

The method of firing the thyristor includes applying a voltage between the first and fourth zones of the body. A plurality of separated regions on the top surface are then illuminated. In response to the illumination, carrier generation is caused in the body of the thyristor by means of photogeneration. The thyristor is then turned on at a plurality of separated locations along the pn junction between the emitter and base zones, the locations being in the immediate vicinity of the light-receiving regions.

BRIEF DESCRIPTION OF THE DRAWINGS

FIGS. 1–5 are perspective views in partial cross-section showing the method of forming a thyristor according to the present invention.

FIG. 6 is a partial top view of the thyristor of FIG. 5.

FIG. 7 is a cross-sectional view taken along line 7—7 of FIG. 6.

FIGS. 8–10 are perspective views in partial cross-section showing the method of forming another embodiment of a thyristor according to the present invention.

FIG. 11 is a partial top view of the thyristor of FIG. 10.

FIG. 12 is a cross-sectional view taken along line 12—12 of FIG. 11.

DESCRIPTION OF THE PREFERRED EMBODIMENT

Referring to FIG. 1, a thyristor according to the present invention is formed beginning with a foundation semiconductor body 20 having opposed top and bottom surfaces 22 and 24, respectively. Body 20 is typically formed of monocrystalline silicon processed to provide a PNP structure having intermediate pn junctions parallel with surfaces 22 and 24. A suitable method of forming body 20 begins with an N type silicon chip into which impurities are subsequently introduced through the top and bottom surfaces. One or more of the conductivity zones may alternatively be formed by epitaxial growth or ion implantation. At least one additional zone is then formed in body 20 to provide a typical thyristor structure having at least four zones of alternate conductivity type, as shown in FIG. 2. The uppermost or first zone 26 is added to the PNP body by any suitable method such as diffusion, epitaxial growth, or ion implantation. The resultant semiconductor body has an NPNP structure. First zone 26 is of N conductivity type; second zone 28 adjacent the first zone and forming the thyristor base zone is of P conductivity type; third zone 30 is of N conductivity type; and fourth zone 32 is of P conductivity type, extending to bottom surface 24. Zones 26 and 30 are designated N+ and N− in FIG. 2 to indicate the relatively higher level of N type impurity doping in zone 26.

To form a first embodiment of a thyristor according to the invention, top surface 22 of body 20 is first coated with a masking layer 35. A suitable photoresist mask can be used. Mask 35 initially covers the entire top surface 22, and portions are removed by conventional photolithographic techniques to produce a masking pattern as shown in FIG. 2. The pattern includes a large central opening 36 in which a plurality of ring-shaped mask sections 38 remain unremoved. Additional openings 40 are formed outside opening 36 to provide emitter shorts.

Following formation of the mask pattern of FIG. 2, conventional etching techniques are employed to etch into the upper surface 22 of body 20. An etching solution is used which attacks the silicon of body 20 but not masking layer 35. Etching proceeds to a depth sufficient to penetrate first zone 26, separating the zone into a plurality of N+ regions on the top surface of the body separated by exposed portions of base zone 28. The resultant configuration includes a plurality of separated emitters extending to top surface 22, as shown in FIG. 3. The N+ region outside mask circle 36 forms a first emitter 42. The pn junction between emitter 42 and base zone 28 is the first emitter turn-on line 44 of the thyristor. Openings 46 in emitter 42, created by openings 40 in the mask, are spaced a predetermined distance outside turn-on line 44. The ring-shaped N+ islands 48 encircled by first emitter 42 comprise a plurality of separated auxiliary emitters which are employed in the amplifying stage of the thyristor. Each emitter 48 has a centrally disposed opening 49 extending through the N+ zone to the base.

The pattern of N+ regions on top surface 22 could alternatively be formed by the well known technique of masked diffusion. A mask layer of silicon dioxide or the like is initially grown or otherwise laid down on the top P-type zone of body 20. Portions of the mask are then removed by conventional photolithgraphic and etching techniques to expose those areas of the surface where N+ regions are to be formed. N-type impurities are then diffused into the exposed areas, producing the desired pattern of emitters on top surface 22.

After the N+ regions have been defined and the mask is removed, top surface 22 is coated by conventional means with a layer of suitable conductive metal, such as aluminum. Portions of the metal layer are then removed by conventional photolithographic and etching techniques to provide a metalization pattern on top surface 22. Referring to FIG. 4, metalization in contact with emitter 42 outside turn-on line 44 comprises an emitter contact 50. The metal layer extends into openings 46 to contact base zone 28 and provide a line of emitter shorts 51. Contact 50 forms the thyristor cathode contact which is connected to an external circuit by lead 52. A metalized circle 54 spaced inwardly from turn-on line 44 forms a control electrode. Electrode 54 is in contact with emitters 48 and also in contact with exposed portions of base zone 28. Openings 55 in control electrode 54 are in registration with openings 49 in emitters 48 to admit light to exposed portions of the base encompassed by the emitters. The exposed base portions form light-receiving regions 56 which are concentric with the circular emitters. The completed thyristor also includes a metalized contact 57 on bottom surface 24 in contact with fourth zone 32, forming the thyristor anode contact. Lead 58 connects anode 57 with an external circuit. Contact 57 is applied either simultaneously with the top surface metalization, or at another time.

Referring to FIG. 5, a plurality of light fibers 60 extending through openings 55 provide preferred means for supplying light to light-receiving regions 56. Light fibers 60 are each fixed in alignment with one of the light-receiving regions 56. The light fibers are preferably conventional glass fiber light pipes having outer diameters of two or three mils. Such light fibers are conventionally employed to carry light-borne information over considerable distances. Any suitable means can be employed for fixing the fibers in place, such as incorporating support members into a housing for the thyristor.

FIG. 6 shows a top view of the assembled thyristor of the first embodiment. Top surface 22 includes six separated light-receiving regions 56 in the first amplifying stage of the thyristor. The six light-receiving regions are each encircled by one of six light-responsive emitters 48 disposed beneath contact 54. The light-responsive emitters 48 are so called because a light pulse on fibers 60 initiates turn-on of the amplifying stage along the junction between emitters 48 and the base. Each light-responsive emitter has an inner radius substantially equal to the diameter of fibers 60. Referring to FIG. 7, the inner edge of the pn junction 70 between each emitter 48 and the base is an amplifying stage turn-on line 71.

In use, the first embodiment thyristor is installed in a circuit by connecting leads 52 and 58 to appropriate circuit terminals. When anode 50 is forward biased relative to cathode 57, only a small forward leakage current passes through the device prior to firing. A similar small reverse leakage current passes when the electrodes are reverse biased. Such forward and reverse blocking states result from a relative absence of carriers in the vicinity of one or more of the pn junctions in the device, as is well known in the thyristor art. When the electrodes are forward biased, the thyristor can be switched on in the manner described below to permit a large forward current to flow through the device.

The method of firing or switching the thyristor into forward conduction is initiated by simultaneously illuminating the separated light-receiving regions 56 on surface 22. Such illumination is preferably accomplished by providing a light source at the far end of light fibers 60. Suitable light sources for this purpose would include light-emitting diodes, lasers, or other conventional sources of light. The light fibers immediately transmit the light to light-receiving regions 56. The light causes hole-carrier pairs to be generated in base zone 28 and also in zone 30 by well known photogenerative processes. Free electrons 73 in the base are immediately drawn toward anode 57 under the influence of the electric field across the device. If holes 75 are generated in sufficient quantity in the base, junction 70 becomes forward biased, causing the emitter to inject electrons into the base. When electrons from emitters 48 begin to move in large numbers across junction 70 and base zone 28, the amplifying stage is turned on. Turn-on occurs at a plurality of separated locations along the separated portions of emitter-base junction 70. The process initiates in the immediate vicinity of the illuminated region, beginning at each turn-on line 71 and spreading radially outwardly along each junction 70. The electron flow from each light-responsive emitter 48 causes control electrode 54 to become positive. By means of conventional amplifying-gate action, the positive voltage on electrode 54 and the resultant current flow through the base between electrode 54 and emitter shorts 51 causes the main part of the thyristor to turn on. Turn-on initiates at turn-on line 44 along the pn junction between first emitter 42 and base 28. Once turned on, the thyristor permits a substantially free flow of current between the anode and cathode leads in the conventional manner.

The thyristor and firing method of the present invention provide for increased di/dt capacity during turn-on over single gate light-fired thyristors. In a single gate design, even with amplifying stages, a single region, generally surrounded by an emitter region, is illuminated. The initial turn-on line extends along the inner boundary of the emitter. Alternatively, where light reaches the base by penetration through the emitter, the turn-on area lies directly beneath the illuminated emitter area. In either case, in a single-gate configuration the amount of emitter-base junction which can be initially turned on is limited by the dimensions of the single illuminated area. In the multigate approach of the present invention, both the length of the initial turn-on line and the immediate area into which turn-on can spread is greatly incresed for a given total illuminated area. Therefore, more of the junction between emitter and base can be turned on in a given period of time, accommodating higher initial values of di/dt without damage.

The multigate approach of the present invention can also be employed in other thyristor configurations. FIGS. 8–10 illustrate the method of forming one alternative embodiment thyristor starting with a PNP body 80 having the same composition as body 20 shown in FIG. 1. To provide at least four zones of alternate conductivity type, an N+ layer is formed on top surface 82 of body 80. As before, the N+ layer can be formed by any suitable means such as diffusion, epitaxial growth, or ion implantation. In the resultant body, first zone 84 is N type and forms the emitter; second zone 86 is P type and forms the base; third zone 88 is N type, having a lesser doping of impurities than zone 84; and fourth zone 90, extending to bottom surface 91, is P type.

To provide a pattern of emitter shorts, a suitable masking layer 92 is applied to top surface 82 in the same manner as mask 35 of the first embodiment. A pattern of openings 94 is then formed in mask 92 by conventional photolighographic techniques. The mask pattern is finally subjected to an etching solution of the type which etches the silicon body 80 and not the mask. Portions of first zone 84 within openings 94 are thereby etched away, exposing the base zone within the resultant openings 95 (see FIG. 9). As before, suitable masked diffusion techniques could alternatively be employed to produce the N+ pattern on the top surface.

Following formation of the N+ pattern a layer of metalization 98 is applied over top surface 82 as shown in FIG. 9. The metal 98 extends into openings 95 to contact base zone 86, forming a plurality of discrete emitter shorts 97. Metalized layer 98 forms emitter contact means on the thyristor. External connection to contact 98 is made through lead 99. As in the first embodiment, the thyristor also includes an anode contact 100 on bottom surface 91 in contact with fourth zone 90. External connection to contact 100 is made through lead 101.

A plurality of openings 105 are formed in contact 98 by conventional photolithographic and etching techniques to expose a plurality of separated light-receiving regions 107 on top surface 82. To provide means for supplying light to light-receiving regions 107, a plurality of light fibers 110 are fixed in alignment with the openings as shown in FIG. 10. As in the first embodiment, the fibers can be fixed in place by suitable means on the thyristor housing or the like.

Referring to FIG. 11, the six light-receiving regions of this embodiment are arranged on top surface 82 in a particular pattern relative to the surrounding emitter shorts 97. Specifically, each of the light-receiving regions is spaced a predetermined minimum distance D from the nearest of the surrounding emitter shorts, and vice-versa. Minimum distance D determines the turn-on sensitivity of the resultant device. The closer the spacing between light-receiving regions 107 and emitter shorts 97 (smaller D), the higher the sensitivity. The radial pattern of the emitter shorts maximizes the spread of the turned-on area of the thyristor after firing, as described below.

Referring to FIG. 12, the firing process is initiated only when the anode contact is forward biased relative to cathode contact 98. Prior to firing only a small leakage current flows across the reverse-biased junction between zones 86 and 88. To switch the thyristor into forward conduction, light is introduced at the far end of light fibers 110. The light is transmitted by the fibers and strikes light-receiving surfaces 107 of emitter 84, penetrating to base zone 86 and also to zone 88. The light causes carrier generation in the semiconductor material by well known photogenerative processes. Free electrons in the base then move toward the anode in the direction of arrow 112. Positive hole current flows radially outwardly toward surrounding emitter shorts 97 in the direction of arrow 114. The hole current forward biases the pn junction between emitter 84 and base 86, with the central spot 116 directly beneath the light-receiving regions being biased the greatest amount. When sufficient forward bias is developed, electrons are injected into the base from the emitter, turning on the device beginning at point 116. The turn-on area spreads radially outward from beneath each light-receiving region. The use of numerous, widely separated light-receiving regions maximizes the total turn-on area. Furthermore, the rapid spread of the turn-on area allows the thyristor to accommodate large initial current gradients (high di/dt's).

The proper positioning of the surrounding emitter shorts encourages the turn-on area to spread uniformly. If, for example, the closest emitter shorts were not at a predetermined distance from the light-receiving regions, the turn-on area would spread unevenly. If sufficient space is available on the top surface, the light-receiving regions can be more widely separated, with each region completely encircled by emitter shorts. Such a configuration would further enlarge the immediate area into which turn-on will spread.

As in the first embodiment, firing the alternative embodiment by simultaneously illuminating separated regions of the emitter yields an improved di/dt rating for the thyristor. The improvement results from the increase in the size of both the area initially turned on and of the immediate area into which turn-on can spread for a given total area of illumination.

In both embodiments of the invention, thyristor turn-on occurs at a plurality of separated locations in the immediate vicinity of the illuminated regions. The present invention provides an improved thyristor di/dt capacity without undesirable impairment of other performance parameters. The invention is preferably used with high intensity light sources such as lasers which will generate increased gate current and further improve di/dt performance.

Alternate thyristor configurations are possible within the scope of the invention. For example, additional amplifying stages can be provided in the first embodiment. The amplifying stage of the first embodiment could include a large central emitter area encompassing all the light-receiving regions. Several large emitters could each encompass a plurality of light-receiving regions. The openings in the light-responsive emitters of the first embodiment could be eliminated, and the light permitted to penetrate to the base as in the alternative embodiment. It is preferred that each light-receiving region be encompassed or surrounded by an emitter to allow for a radially outward spread of the turn-on area, although alternative non-encompassing configurations are possible. Furthermore, there is no limitation on the number of light-receiving regions other than the practical limit on the number of light fibers which can be conveniently handled.

Additional alternative thyristor constructions would occur to those skilled in the art. Alternative methods of forming the thyristors could be employed. For example, the thyristor could be of a reverse configuration with a P-type emitter and an N-type base. Thyristor devices having more than four alternative zones could also employ the multigate feature of the invention.

A light-fired thyristor has been provided having improved di/dt performance. The method of firing by the illumination of widely separated light-receiving areas increases the initial turned-on area of the thyristor.

What is claimed is:

1. A light-fired thyristor comprising: a semiconductor body having at least four zones of alternate conductivity type and having a top surface, a first said zone extending to said top surface, said first zone including at least one emitter, and a plurality of separated light-receiving regions on said top surface for receiving light to initiate thyristor turn-on at a plurality of separated locations.

2. A light-fired thyristor as in claim 1 in which said first zone includes a plurality of separated emitters extending to said top surface, including a first said emitter having an emitter electrode in contact therewith and at least one light-responsive emitter, said at least one light-responsive emitter encompassing said light-receiving regions on said top surface.

3. A light-fired thyristor as in claim 2 in which a second said zone in said body adjacent said first zone forms a base, portions of said base extending to said top surface between said separated emitters, including a control electrode in contact with said at least one light-responsive emitter and also in contact with said base, said control electrode having openings therein to admit light to said light-receiving regions.

4. A light-fired thyristor as in claim 3 in which said at least one light-responsive emitter includes openings extending through said first zone to said base, said light-receiving regions being disposed in said openings whereby said base is directly illuminated.

5. A light-fired thyristor as in claim 4 together with a plurality of light fibers, each said light fiber being fixed in alignment with one of said light-receiving regions of said thyristor.

6. A light-fired thyristor as in claim 4 in which said first emitter substantially encircles said light-responsive emitters.

7. A light-fired thyristor as in claim 6 including a plurality of light-responsive emitters, each said light-responsive emitter encircling a single said light-receiving region centrally disposed relative to said light-responsive emitter.

8. A light-fired thyristor as in claim 1 including emitter electrode means in contact with said at least one emitter, said emitter electrode means having openings therein to admit light to said light-receiving regions.

9. A light-fired thyristor as in claim 8 in which a second said zone in said body adjacent said first zone forms a base, said emitter electrode means extending through said first zone into contact with said base at a plurality of discrete locations to form a plurality of emitter shorts.

10. A light-fired thyristor as in claim 9 in which said emitter shorts are located a minimum distance from said light-receiving regions on said top surface, at least a portion of said emitter shorts being positioned at a predetermined distance from the nearest of said light-receiving regions.

11. A light-fired thyristor as in claim 10 together with a plurality of light fibers, each said light fiber being fixed in alignment with one of said light-receiving regions of said thyristor.

12. A light-fired thyristor comprising: a semiconductor body having at least four zones of alternate conductivity type and having a top surface, a first said zone extending to said top surface, a second said zone adjacent said first zone forming a base, said first zone including a first emitter, an emitter electrode on said top surface in contact with said first emitter, said first zone further including at least one light-responsive emitter extending to said top surface and spaced apart from said first emitter, said base extending to said top surface between said first emitter and said at least one light-responsive emitter, a control electrode on said top surface in contact with said at least one light-responsive emitter and also in contact with said base, a plurality of separated light-receiving regions on said top surface, said at least one light-responsive emitter encompassing said light-receiving regions on said top surface whereby light admitted to said light-receiving regions initiates thyristor turn-on at a plurality of separated locations.

13. A light-fired thyristor as in claim 12 in which said first zone includes a plurality of separated light-responsive emitters each being substantially circular, each said light-responsive emitter encompassing one said light-receiving region substantially concentric with said light-responsive emitter.

14. A light-fired thyristor as in claim 13 together with a pluraltiy of light fibers, each said light fiber being fixed in alignment with one of said light-receiving regions of said thyristor.

15. A light-fired thyristor as in claim 13 in which each said light-responsive emitter includes an opening extending through said first zone to said base, said light-receiving regions being disposed in said openings whereby said base is directly illuminated.

16. A method of switching a light-fired thyristor of the type having a semiconductor body having at least four zones of alternate conductivity type and having opposed top and bottom surfaces, a first said zone extending to said top surface and a fourth said zone extending to said bottom surface, said first zone including at least one emitter, and a second said zone adjacent said first zone forming a base wherein a pn junction extends between said first zone and said base, comprising the steps of: applying a voltage between said first and fourth zones, illuminating a plurality of separated regions on said top surface, causing carrier generation in said body by photogeneration in response to said illumination, and turning on said thyristor at a plurality of separated locations along said pn junction by means of said generated carriers, said locations being in the immediate vicinity of said illuminated regions.

17. A method as in claim 16 in which said thyristor includes an amplifying stage having at least one light-responsive emitter in said first zone spaced apart from a first said emitter in said first zone, said base extending to said top surface between said emitters, and having a control electrode in contact with said at least one light-responsive emitter and also in contact with said base, said step of applying voltage including applying voltage between said first emitter and said fourth zone, said illuminating step including illuminating a plurality of separated regions on said top surface encompassed by said at least one light-responsive emitter, and said step of turning on said thyristor including turning on said amplifying stage at a plurality of separated locations along said pn junction between said at least one light-responsive emitter and said base, and then turning on said thyristor along said pn junction between said first emitter and said base.

18. A method as in claim 16 in which said thyristor includes emitter electrode means on said top surface, said emitter electrode means extending through said first zone into contact with said base at a plurality of discrete locations to form a plurality of emitter shorts, said illuminating step including illuminating a plurality of separated regions on said top surface, said regions each being a predetermined minimum distance from the nearest of said emitter shorts.

* * * * *